United States Patent [19]

Epworth

[11] Patent Number: 5,715,265
[45] Date of Patent: Feb. 3, 1998

[54] DISPERSION COMPENSATION

[75] Inventor: Richard Edward Epworth, Sawbridgeworth, United Kingdom

[73] Assignee: Northern Telecom Limited, Montreal, Canada

[21] Appl. No.: 710,283

[22] Filed: Sep. 13, 1996

[51] Int. Cl.[6] .................................................. H01S 3/13
[52] U.S. Cl. .................. 372/38; 372/20; 372/28; 372/32
[58] Field of Search .................. 372/6, 9, 18, 20, 372/25, 26, 28, 29, 32, 33, 38; 385/15, 27, 37, 123

[56] References Cited

U.S. PATENT DOCUMENTS

| | | | |
|---|---|---|---|
| 4,953,939 | 9/1990 | Epworth | 385/15 X |
| 5,243,610 | 9/1993 | Murata | 372/6 X |
| 5,627,848 | 5/1997 | Fermann et al. | 372/18 |
| 5,633,885 | 5/1997 | Galvanauskas et al. | 372/25 |

*Primary Examiner*—John D. Lee
*Attorney, Agent, or Firm*—John D. Crane

[57] ABSTRACT

The emission waveband of a data modulated laser signal is locked to the reflection waveband of a chirped Bragg grating dispersion compensator by means of a phase locked loop regulating the temperature of the laser or the magnitude of the drive current applied to it.

4 Claims, 9 Drawing Sheets

DISPERSION COMPENSATION

BACKGROUND TO THE INVENTION

With the advent of optical amplifiers which can compensate for fibre loss, the reach of fibre systems at 10 Gb/s and beyond, is limited by chromatic dispersion. Chromatic dispersion causes different parts of the signal spectrum to arrive at the distant end of the system at different times. An optical signal carrying information has a finite bandwidth (spread in wavelengths). If these propagate at different velocities along the fibre, the narrow pulses will be dispersed. The dominant cause of chromatic dispersion is material dispersion, the variation in the refractive index versus wavelength of silica, the basic material from which all low loss transmission fibres are made.

Chromatic dispersion is a potentially reversible process because the optical frequency of any part of the signal contains the information of the delay it has suffered. Optical dispersion compensation requires an element which can produce a delay versus frequency characteristic equal and opposite to that of the fibre. It may be optically compensated either by using special dispersion shifted transmission fibre in the transmission path or by localised dispersion compensation (equalisation).

Figure 1:
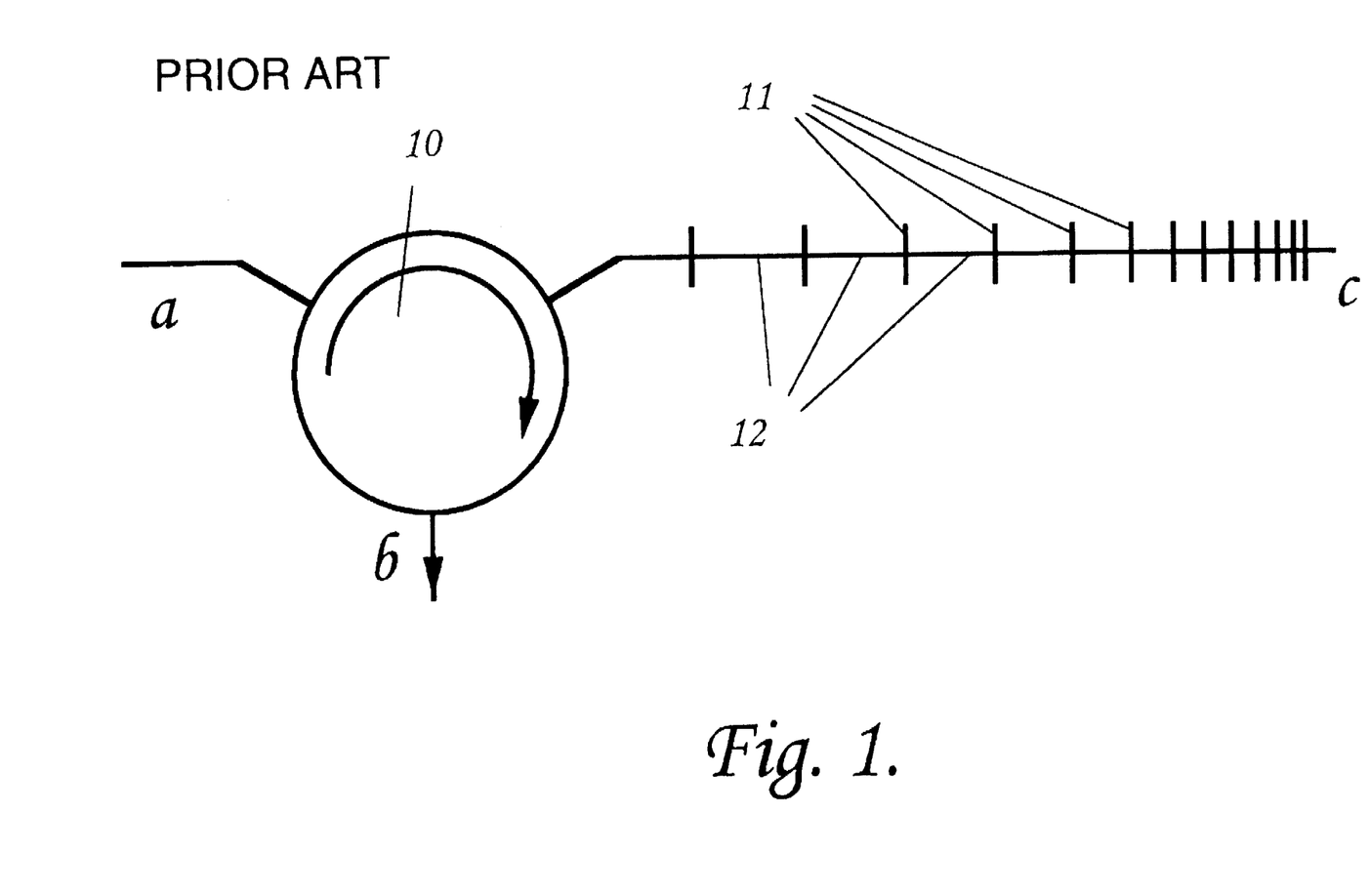
FIG. 1, to which previous reference has been made, is a schematic diagram of a chirped Bragg grating dispersion compensator.

A convenient form of localised dispersion compensator is the chirped Bragg reflector grating dispersion compensator, the principles of operation of which are described in GB 2 161 612 B. Such a device consists in essence of a circulator 10 (FIG. 1) optically coupled with a chirped Bragg reflective grating 11 formed in a length 12 of single mode optical waveguide, typically optical fibre waveguide. (GB 2 161 612 B also explains that a 2×2 coupler, either a 3 dB coupler or a polarisation beam splitting coupler with quarter-wave plates, may be used in place of the circulator.) Typically the shorter wavelengths of an optical signal of finite spectral width propagating in an optical fibre transmission system propagate faster than the longer wavelengths, and so the chirped grating is oriented so that the shorter wavelengths propagate a greater distance into it before reflection than do the slower longer wavelengths. Light, launched into the compensator by way of port a, emerges dispersion compensated by way of port b. Light launched into the compensator by way of port a that is of a wavelength outside the reflection waveband of the grating will emerge by way of port c, and so it is seen that in a wavelength division multiplexed transmission system a compensator may be simultaneously employed, not only as a compensator, but also as a channel dropping filter. The compensator may be used, after dispersion has occurred, in order to "image" a dispersion spread pulse back into the bit period time slot. Alternatively it may be used to spread a pulse upstream of the passage of the pulse through the dispersive transmission path, in which case the pulse is spread by the compensator, and the dispersion in the transmission medium then serves to collapse it to its former width.

With the Bragg grating compensator, there are several technical problems which must be overcome to have a practical component and system. The basic device is narrow band, and the devices demonstrated so far typically have little more bandwidth than the minimum required to pass all the signal bandwidth. Today's transmitter lasers typically have an uncertainty in their operating wavelength of several nanometers (e.g.±2.5 nm). As this is much larger than the signal bandwidth (e.g. 0.15 nm at the transmitter, or 0.23 nm at the receiver, for a 10 G/bit/s system), something must be done to pull them into alignment.

There are certain advantages if the grating can be tuned to the laser. Fibre gratings are intrinsically very stable, being silica based. Their temperature coefficient is between 5 and 7 ppm/degree Celsius. While this is advantageous for many applications, it means temperature tuning alone cannot provide sufficient range for today's transmitters. (5 nm range at 1550 nm would require more than 500 degrees Celsius change, and the gratings are bleached out by such temperatures). An alternative is to apply stress to the fibre grating to change it's Bragg wavelength. The wavelength strain ($\delta\lambda_0/\lambda_0$) is about 0.65 of the mechanical strain (dL/L). This allows a much larger tuning range, though fibre fatigue is likely to present problems where significant strain is applied over many years. A 5 nm range at 1550 nm would require about 0.5% strain. While not impossible in the laboratory, this is a high level of strain to apply for a long period of time. Fibre fatigue may be reduced by operating in compression, but this requires some mechanical constraint. Stress may be applied by a variety of methods. For broader WDM applications of gratings, it would be attractive to be able to tune over the full erbium window. However this would require about 3% strain, an unacceptable figure.

SUMMARY OF THE INVENTION

According to the present invention there is provided a method of locking the emission waveband of a data modulated laser signal with respect to the waveband of a chirped Bragg grating dispersion compensator, wherein an oscillatory signal is employed to impress a frequency modulation upon the data modulated signal to provide an optical input to the dispersion compensator, and wherein a control signal is derived from the light reflected by or transmitted by the chirped grating of the compensator, which control signal is mixed with the oscillatory signal to provide a regulatory signal employed in a feedback control loop to regulate the emission wavelength of the laser.

Locking may alternatively be achieved by using the oscillatory signal to impress a frequency modulation upon the reflection waveband of the Bragg grating dispersion compensator. This may for instance be achieved by using the oscillatory signal to strain the grating in an oscillatory manner. For this purpose the waveguide with the grating may be secured to a cantilever which is maintained in flexural vibration by the oscillatory signal.

Accordingly, the invention further provides a method of locking the emission waveband of a data modulated laser signal with respect to the waveband of a chirped Bragg grating dispersion compensator to which that data modulated laser signal is applied, wherein an oscillatory signal is employed to impress a frequency modulation upon the waveband of the chirped Bragg grating of the dispersion compensator, and wherein a control signal is derived from the light reflected by or transmitted by the chirped grating of the compensator, which control signal is mixed with the oscillatory signal to provide a regulatory signal employed in a feedback control loop to regulate the emission wavelength of the laser.

It is by no means obvious that the dispersion compensator can, as a practical matter, be made to function itself as the wavelength regulation filter for stabilising the emission wavelength of the laser. This is because such stabilisation requires the generation of a control signal for operating a feedback control loop, and the generation of such an error signal necessarily implies that the data-modulated laser emission must be taken periodically in and out of registry with the reflection waveband of the dispersion compensator.

When they are out of registry, will there not be an unacceptable distortion of the modulation giving rise to excessive error generation? A theoretical analysis of the problem has revealed that error generation can be kept within reasonable limits while still permitting the generation of a control signal of adequate proportions for laser emission wavelength regulation.

BRIEF DESCRIPTION OF THE DRAWINGS

There follows a description of a method, embodying the invention in a preferred form, of locking the emission waveband of a data modulated laser to the waveband of a chirped Bragg grating dispersion compensator. The description refers to the accompanying drawings, in which.

DETAILED DESCRIPTION OF PREFERRED EMBODIMENTS

Figure 2:
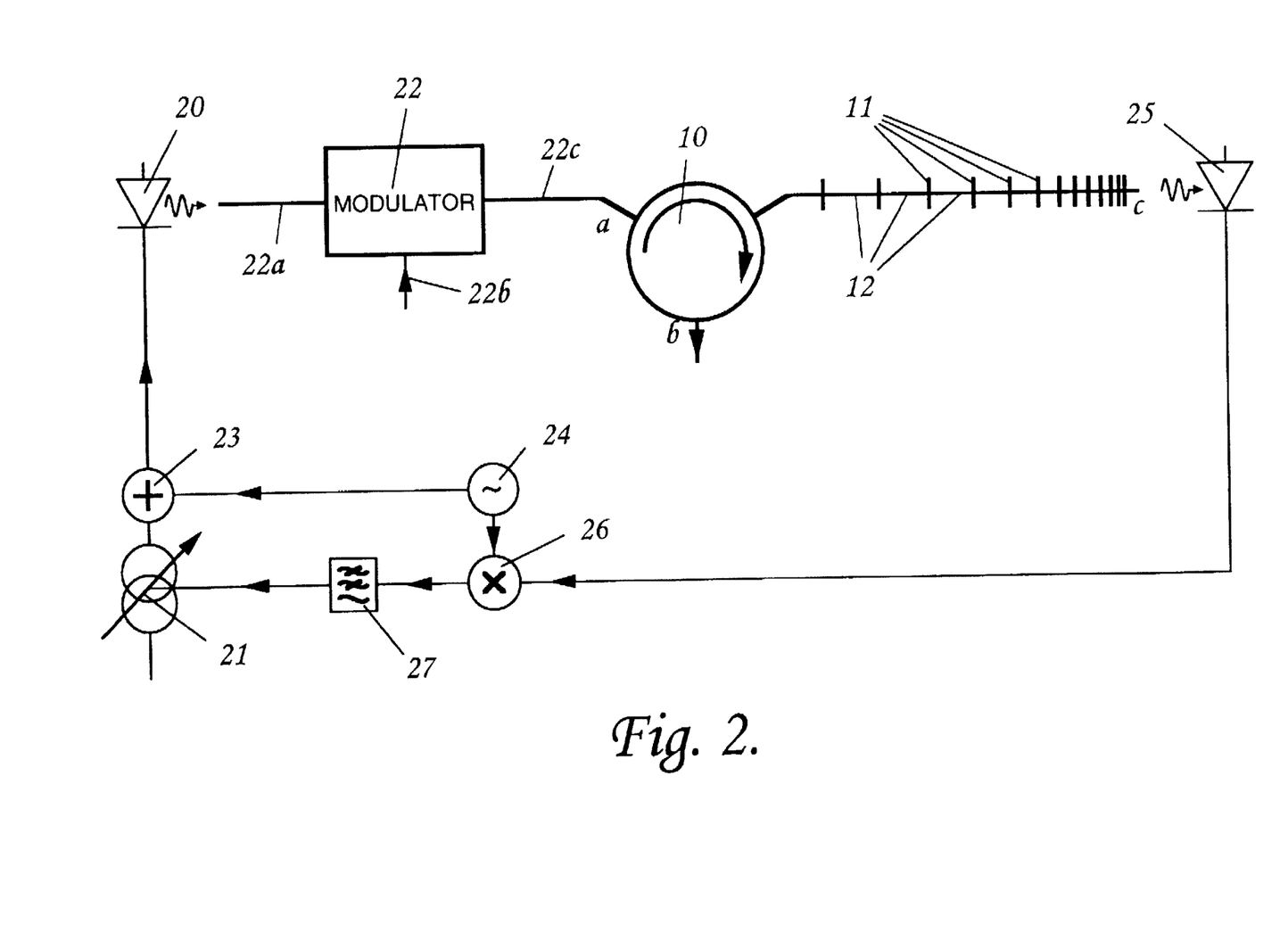
FIG. 2 is a schematic diagram of the dispersion compensator of FIG. 1 connected to a data modulated laser in such a way as to lock the emission waveband of the laser to the waveband of the compensator.

Referring now to FIG. 2, an injection laser 20 is driven with current from a variable current drive source 21 so as to provide an optical output coupled into the optical input port 22a of an optical modulator 22 fed with data by way of an electrical input port 22b. The output 22c of the optical modulator 22 is applied to the dispersion compensator of FIG. 1 comprising circulator 10 and grating 11 on fibre 12. The spectral emission of the laser is narrower than the reflection bandwidth of the dispersion compensator, but is broadened by the data modulation.

It may be preferred to arrange that the data modulated bandwidth of the laser emission is substantially matched in width with that of the dispersion compensator. A close match will not always be possible in the case of a dispersion compensator that is required to be adjustable so as to be capable for use in different systems involving different transmission lengths and hence different amounts of dispersion that have to be compensated. This is because such adjustment, for instance using bending of the fibre containing the grating in order to stretch or compress it longitudinally so as to alter the chirp, also alters the grating bandwidth. Adjustment to match the dispersion of shorter transmission lengths requires more chirp, and this greater chirp provides the grating with greater bandwidth.

Using an adder 23, a modulation is impressed by an oscillator 24 upon the current drive to the laser 20 provided by the source 21 so as to impart a dither to the wavelength of light emitted by the laser. (This wavelength dither may alternatively be provided by using the oscillator 24 to dither the temperature of the laser rather than its mean drive current.) If the spectral position of the waveband of the data modulated laser emission is slightly displaced with respect to that of the dispersion compensator, this dither produces amplitude modulation of the optical output from port b of the dispersion compensator 10 (at the dither frequency), and also in that from its port c. As the laser emission waveband passes from one side of registry, through exact registry, to the other side—so the amplitude of the amplitude modulation passes through zero with a $\pi$ change of phase. This amplitude modulation is detected by a photodetector 25 to produce a photocurrent which is mixed with an output of the oscillator 24 in mixer (synchronous detector) 26 to provide, after low-pass filtering in a filter 27, a feedback control loop control signal applied to the source 21 so as to regulate the magnitude of the current that it delivers to the laser 20. If convenient the frequency of modulation produced by oscillator 24 is a frequency which also has the effect of suppressing stimulated Brillouin scattering.

It has already been stated earlier that the oscillatory frequency modulation can be applied to the dispersion compensator instead of to the laser. Other variants include using temperature, instead of drive current, to vary the emission wavelength of the laser. For instance, instead of using the output of the synchronous detector to vary the current drive supplied to the laser 20 from source 21, that output may be used to regulate the temperature of the laser. This will generally afford a greater wavelength timing range than is available by regulating the current drive. Use of this kind of temperature control is compatible with retaining, if desired, drive current control for the frequency modulation provided by oscillator 24. Nor is it necessary for the oscillatory signal required for generating modulating the emission wavelength of the laser to be provided by a simple sinusoidal output oscillator. This oscillatory signal can for instance be provided by repetitions of a short sequence code. In this case the mixer 26 is required to function as a cross-correlator.

Figure 3:
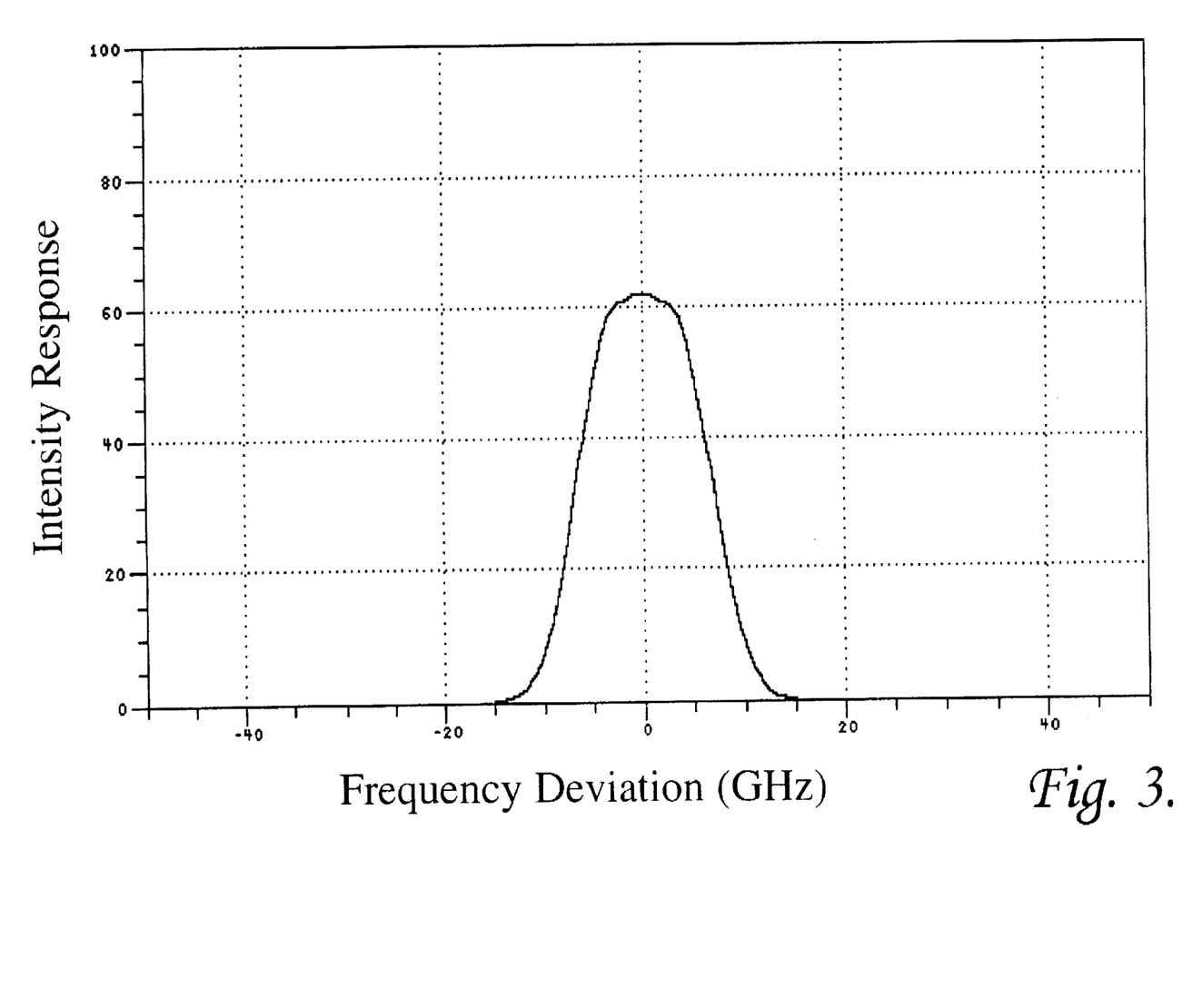
FIG. 3 is the computed wavelength response of the grating of a dispersion compensator.
Figure 4:
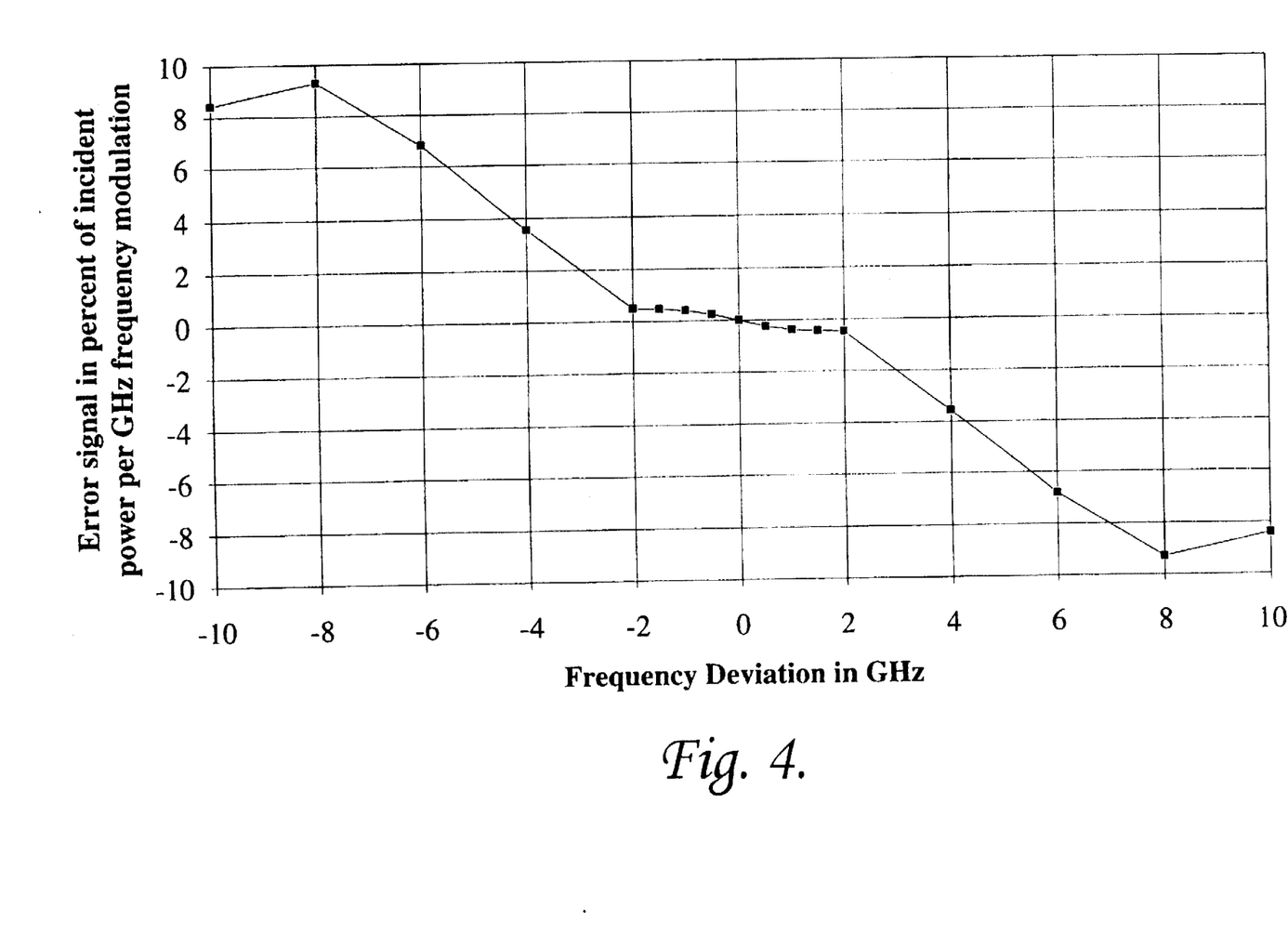
FIGS. 4, 5, and 6 depict, as a function of wavelength over a range of ±10 GHz, respectively the computed error signal, the computed eye closure penalty, and the computed loss associated with the dispersion compensator of FIG. 3, and FIGS. 7, 8 and 9 depict on a larger scale the same parameters as those of FIGS. 4, 5 and 6, but over the more restricted range of ±2 GHz.
Figure 5:
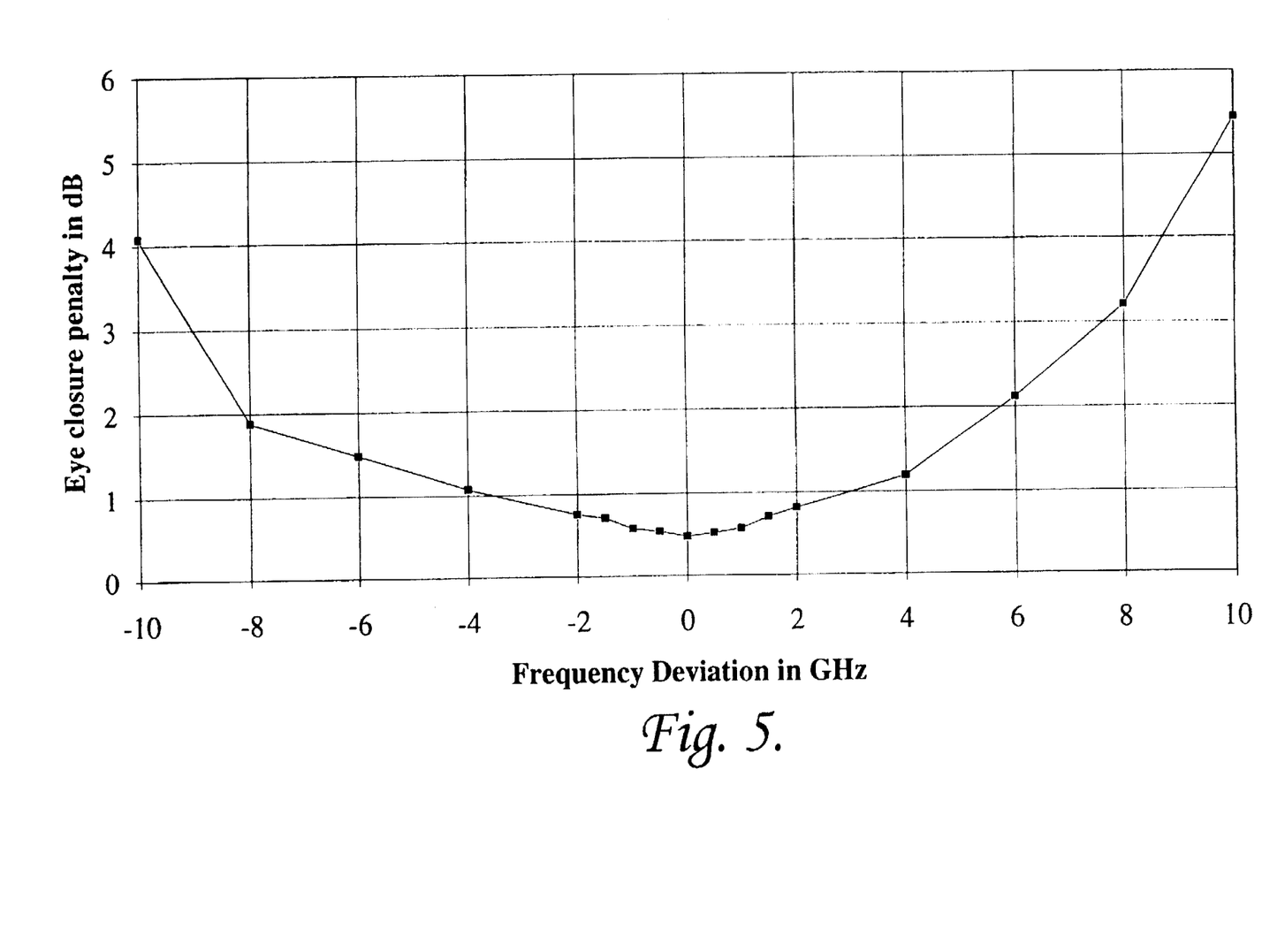
Figure 6:
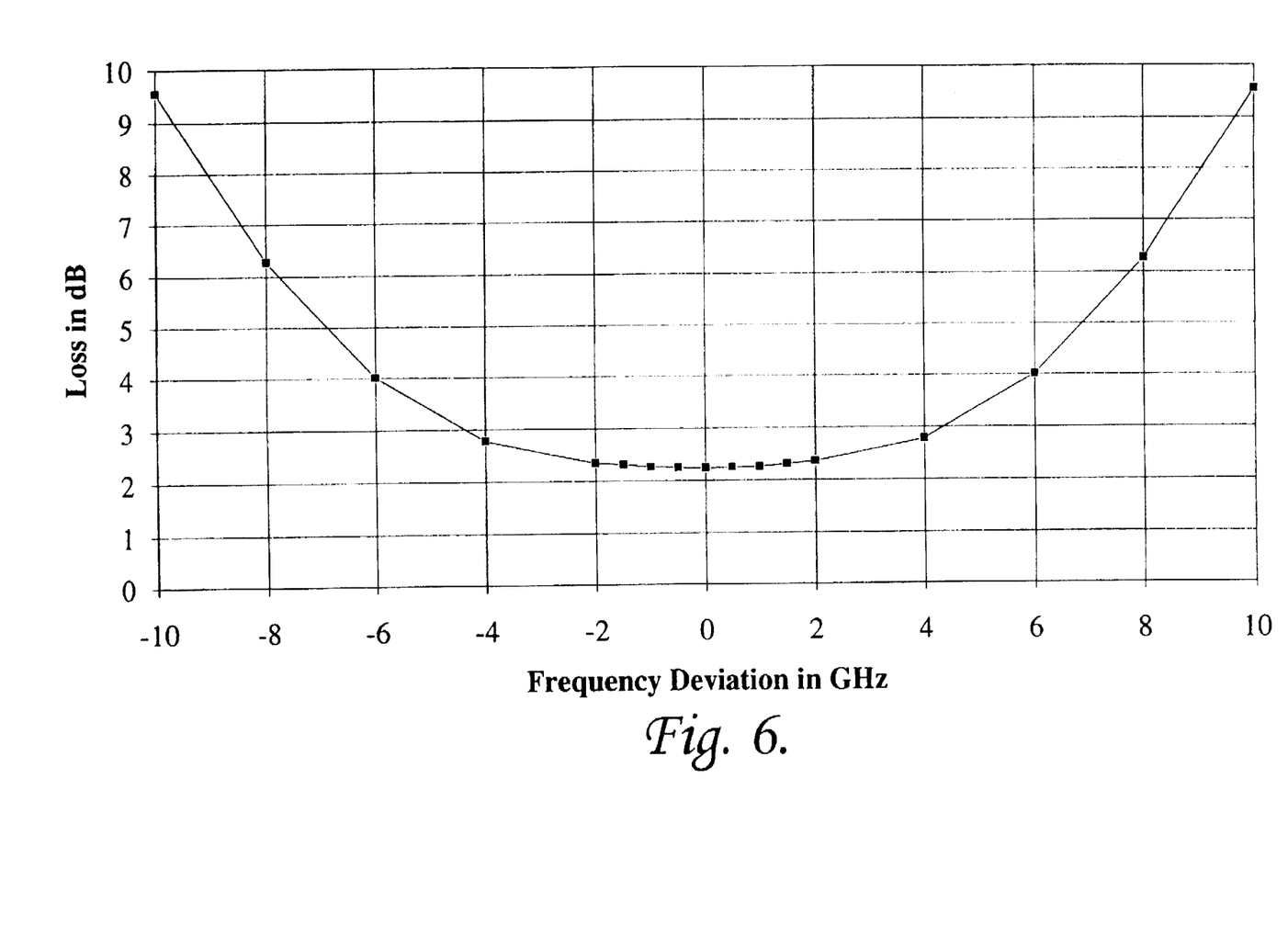
Figure 7:
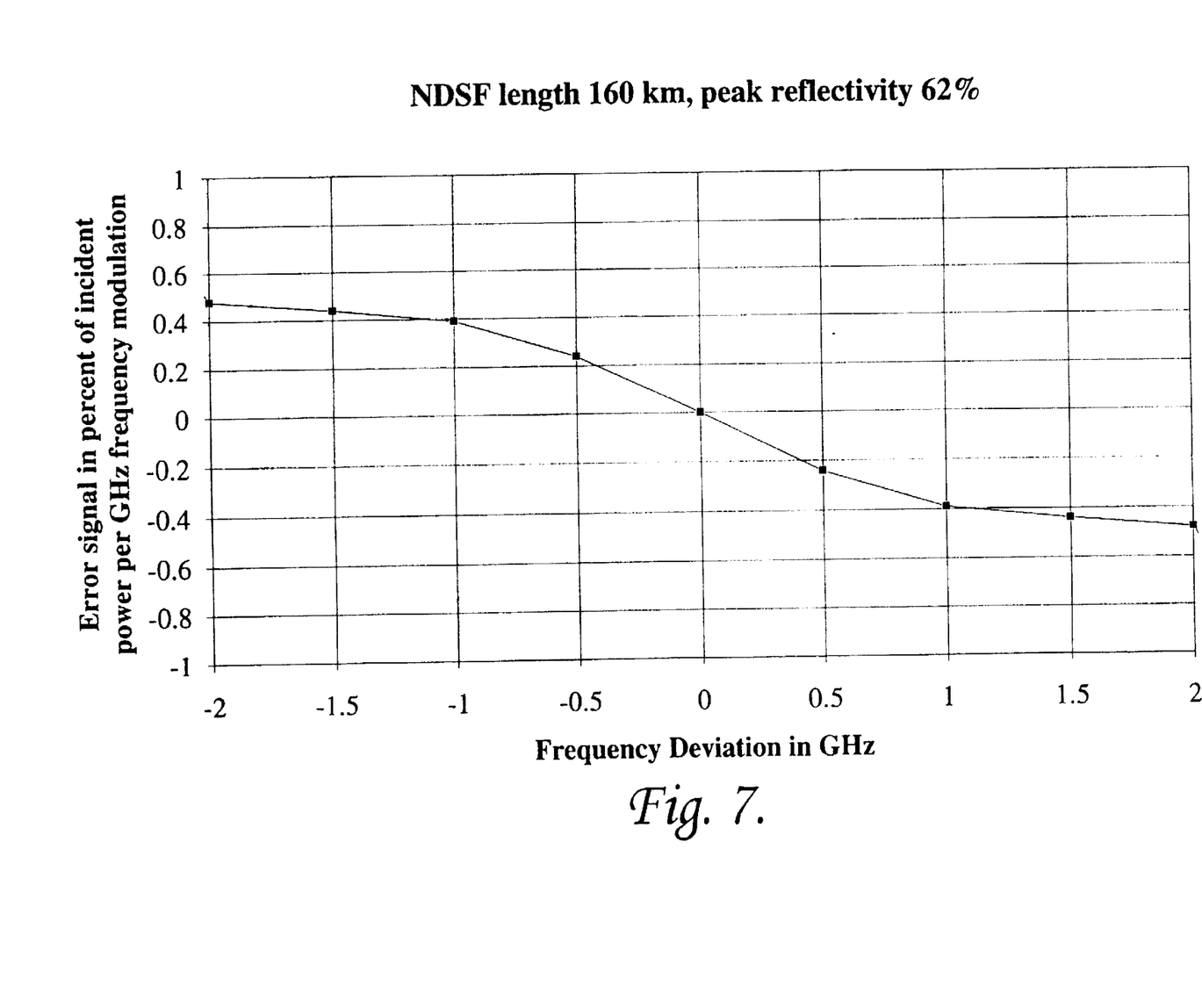
Figure 8:
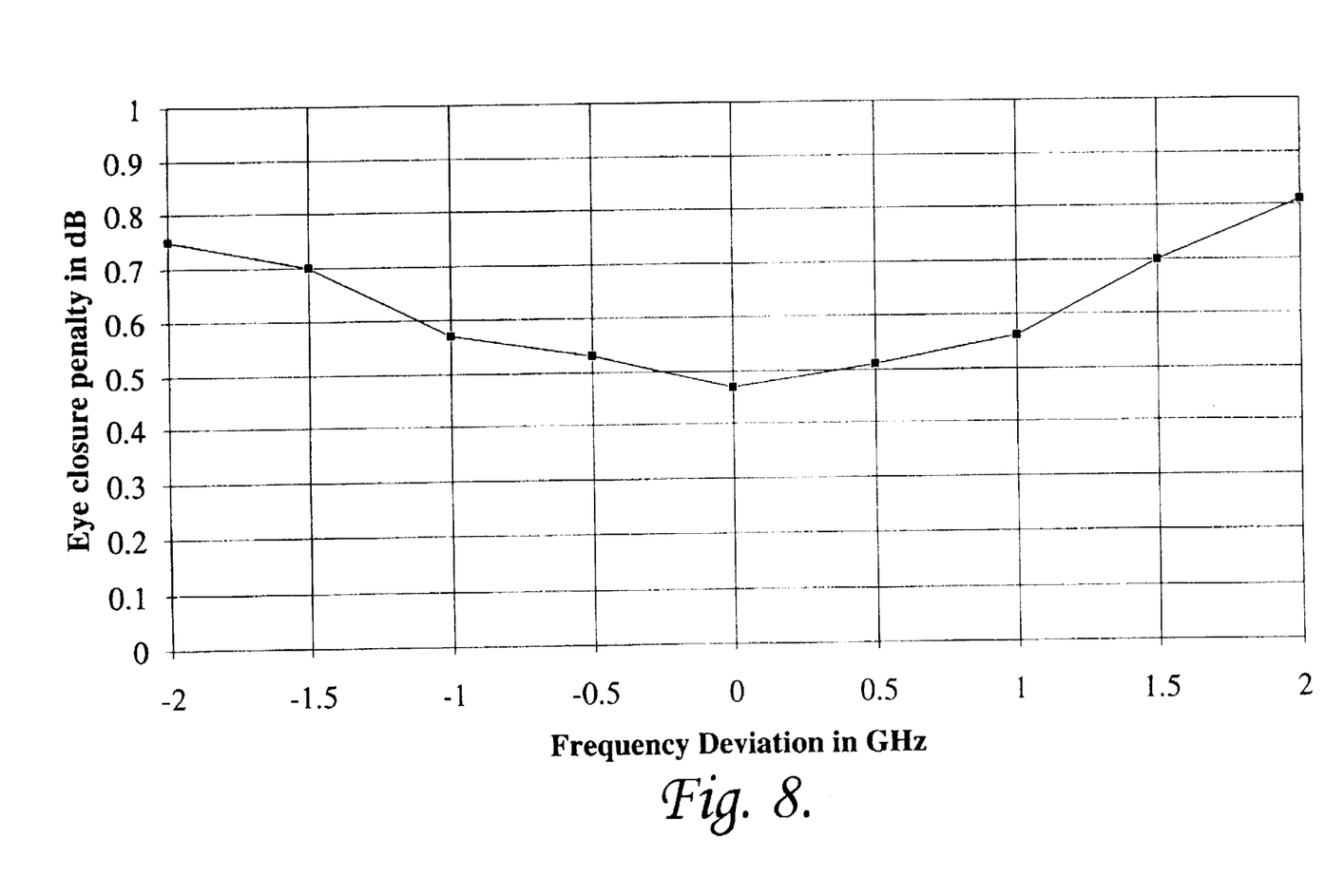
Figure 9:
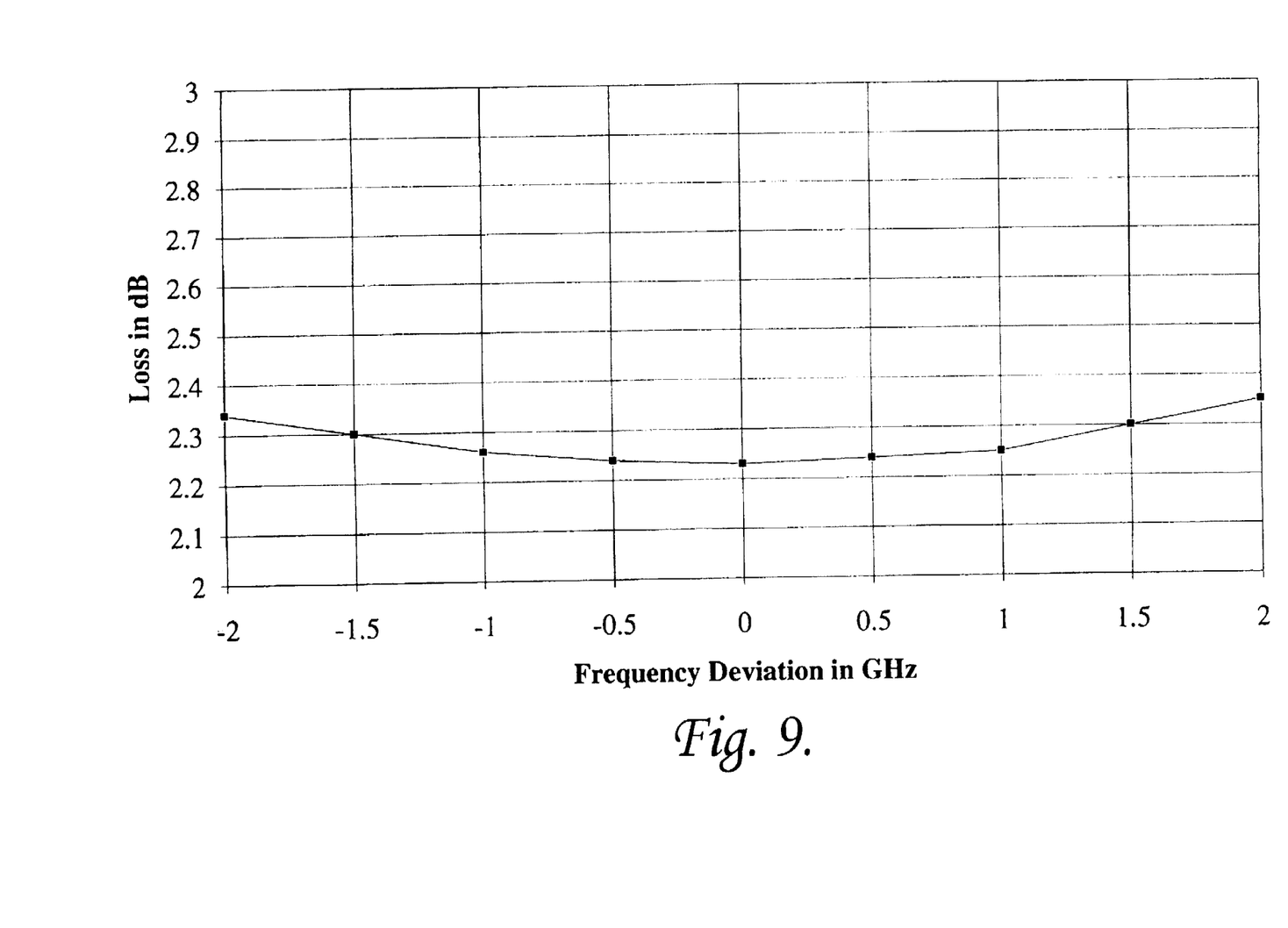

The method of the present invention by which the emission waveband of a data modulated laser signal is locked to the waveband of the chirped Bragg grating dispersion compensator involves deriving an error signal whenever the emission departs from registry. Such an error signal is generated in a manner that necessarily involves attenuation of signal. Attenuation of the signal produces an increased risk of errors occurring in the transmission of the data. This makes the invention look, at first sight, unattractive. To investigate the severity of this problem, a 62% peak reflectivity 5 cm long grating with than shading tailored to equalise 160 km of non-dispersion-shifted fibre for 10 Gbit/s (chirp bandwidth ±11.3 GHz) traffic was modelled using a simulation. FIG. 3 shows the computed wavelength response of the grating. FIG. 4 shows the computed error signal expressed as a percent of incident power per GHz frequency modulation. This error signal is plotted over the range ±10 GHz. FIG. 5 shows the computed eye closure penalty associated with the error signal, plotted over the same range, while FIG. 6 shows the loss in dB over the same range. FIGS. 7, 8 and 9 show, on a larger scale, the central frequency range ±2 GHz portions of FIGS. 4, 5 and 6 respectively. The gradient of the grating amplitude response was also determined, this being a measure for the f1 signal amplitude when dither is applied to either the laser emission or to the grating. From comparable work with an étalon tracking unit functioning with a remnant f1 amplitude of 0.5% of the peak signal in transmission for an étalon dither amplitude equal to 5 GHz dither, it is believed that a gradient of 0.1%/GHz is sufficient to mark a drift away from the optimum tracking point (zero f1 signal). From these figures it is seen that the minimum eye closure is 0.47 dB, and that over a tuning range of ±2 GHz it increases only to 0.8 dB. The device loss goes from 2.23 dB up to 2.33 dB. The f1 amplitude is monotonic, and goes from +0.5%/GHz to −0/5%/GHz with a zero crossing at the point of lowest eye closure. Accordingly tracking appears entirely possible under these conditions.

Simulations have also been performed based on different conditions, and it has been noticed that problems can arise if the spectral bandwidth of the data modified signal is significantly smaller than that of the dispersion compensator, and the latter is relatively flat topped over a range of greater spectral width than the former. The problem is that under these conditions the laser emission wavelength can change to a significant extent without inducing any error signal. This should not cause data errors because correct equalisation of the dispersion will be achieved provided that the signal spectrum is contained within the bandwidth of the compensator. An error signal will be produced if it tries to move outside this range. It will however result in poorer wavelength stabilisation. The solution to this problem is to apodise the grating so as to give a rounded top to its spectral characteristic.

I claim:

1. A method of locking the emission waveband of a data modulated laser signal with respect to the waveband of a chirped Bragg grating dispersion compensator, wherein an oscillatory signal is employed to impress a frequency modulation upon the data modulated signal to provide an optical input to the dispersion compensator, and wherein a control signal is derived from the light reflected by or transmitted by the chirped grating of the compensator, which control signal is mixed with the oscillatory signal to provide a regulatory signal employed in a feedback control loop to regulate the emission wavelength of the laser.

2. A method of locking the emission waveband of a data modulated laser signal with respect to the waveband of a chirped Bragg grating dispersion compensator, which method is as claimed in claim 1, and wherein the grating is apodised to optimise an error signal for varying chirp magnitudes.

3. A method of locking the emission waveband of a data modulated laser signal with respect to the waveband of a chirped Bragg grating dispersion compensator to which that data modulated laser signal is applied, wherein an oscillatory signal is employed to impress a frequency modulation upon the waveband of the chirped Bragg grating of the dispersion compensator, and wherein a control signal is derived from the light reflected by or transmitted by the chirped grating of the compensator, which control signal is mixed with the oscillatory signal to provide a regulatory signal employed in a feedback control loop to regulate the emission wavelength of the laser.

4. A method of locking the emission waveband of a data modulated laser signal with respect to the waveband of a chirped Bragg grating dispersion compensator, which method is as claimed in claim 3, and wherein the grating is apodised to optimise an error signal for varying chirp magnitudes.

* * * * *

UNITED STATES PATENT AND TRADEMARK OFFICE
CERTIFICATE OF CORRECTION

| | | |
|---|---|---|
| PATENT NO. | : 5,715,265 | Page 1 of 1 |
| APPLICATION NO. | : 08/710283 | |
| DATED | : February 3, 1998 | |
| INVENTOR(S) | : Richard E. Epworth | |

It is certified that error appears in the above-identified patent and that said Letters Patent is hereby corrected as shown below:

On the title page insert the following: item -- [30] Foreign Application Priority Data
September 26, 1995 [GB] United Kingdom................9519614 --

Signed and Sealed this

Fifth Day of August, 2008

JON W. DUDAS
*Director of the United States Patent and Trademark Office*